United States Patent [19]
Havey et al.

[11] Patent Number: 5,943,211
[45] Date of Patent: Aug. 24, 1999

[54] HEAT SPREADER SYSTEM FOR COOLING HEAT GENERATING COMPONENTS

[75] Inventors: Mort L. Havey, Dallas; William Robert Hitch, Garland, both of Tex.

[73] Assignee: Raytheon Company, Lexington, Mass.

[21] Appl. No.: 08/848,998

[22] Filed: May 2, 1997

Related U.S. Application Data

[60] Provisional application No. 60/064,857, Apr. 18, 1997.

[51] Int. Cl.[6] .................................................. H05K 7/20
[52] U.S. Cl. .......................... 361/699; 62/64; 62/259.2; 165/80.4; 174/15.1; 361/695
[58] Field of Search ............................ 62/64; 165/80.4, 165/104.33, 903, 908; 174/15.1; 257/714; 361/688–689, 698–699

[56] References Cited

U.S. PATENT DOCUMENTS

| | | | |
|---|---|---|---|
| 2,845,472 | 7/1958 | Narbutovskih | 174/15 |
| 3,004,406 | 10/1961 | Foote et al. | 62/373 |
| 3,339,373 | 9/1967 | Mobius et al. | 62/64 |
| 3,801,241 | 4/1974 | Martin et al. | 418/152 |
| 4,056,949 | 11/1977 | Hahn | 62/373 |
| 4,111,614 | 9/1978 | Martin et al. | 417/420 |
| 4,127,365 | 11/1978 | Martin et al. | 417/420 |
| 4,129,845 | 12/1978 | Benke | 174/15.1 |
| 4,163,164 | 7/1979 | Pieters | 310/103 |
| 4,165,206 | 8/1979 | Martin et al. | 417/310 |
| 4,276,570 | 6/1981 | Benke et al. | 174/15.1 |
| 4,371,149 | 2/1983 | Takeuchi et al. | 266/90 |
| 4,407,136 | 10/1983 | de Kanter . | |
| 4,493,625 | 1/1985 | Pieters | 418/126 |
| 4,711,431 | 12/1987 | Viannay | 266/114 |
| 4,846,641 | 7/1989 | Pieters | 418/70 |
| 5,096,390 | 3/1992 | Sevrain et al. | 417/420 |
| 5,131,233 | 7/1992 | Cray et al. | 62/64 |
| 5,220,804 | 6/1993 | Tilton et al | 62/64 |
| 5,311,931 | 5/1994 | Lee . | |

*Primary Examiner*—Gregory Thompson
*Attorney, Agent, or Firm*—Baker & Botts, L.L.P.

[57] ABSTRACT

An isothermal equilibrium system takes point sources of heat generated by the operation of heat generating components and spreads the heat throughout the system where the heat may be dissipated. An atomizer for atomizing a liquid coolant, is positioned inside a sealed housing. The atomized liquid coolant is distributed as a thin film over the surface of the heat generating components and the wall of the sealed housing. Heat is transferred from the surface of the heat generating components by vaporization of at least a portion of the thin film of liquid coolant. The coolant vapor condenses on the housing and other cool surfaces and returns to the liquid state. The system heat is then removed from the outer surfaces of the housing using conventional heat transfer mechanisms including free or forced air convection and/or circulation of liquid coolant over the exterior of the housing. If additional cooling is desired, heat exchanger tubes may be included inside the sealed housing. An input liquid or gaseous coolant is circulated through the exchanger tubes. Heat is transferred to the coolant and then conducted away from the heat generating component housing.

8 Claims, 6 Drawing Sheets

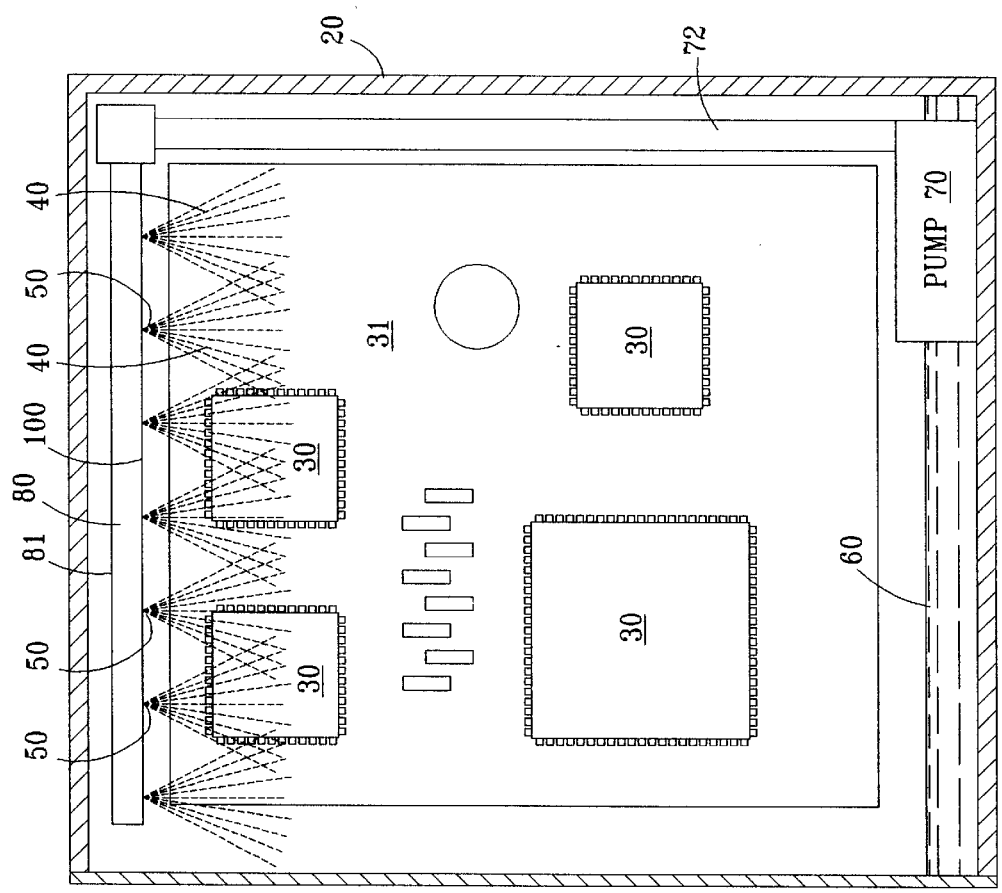
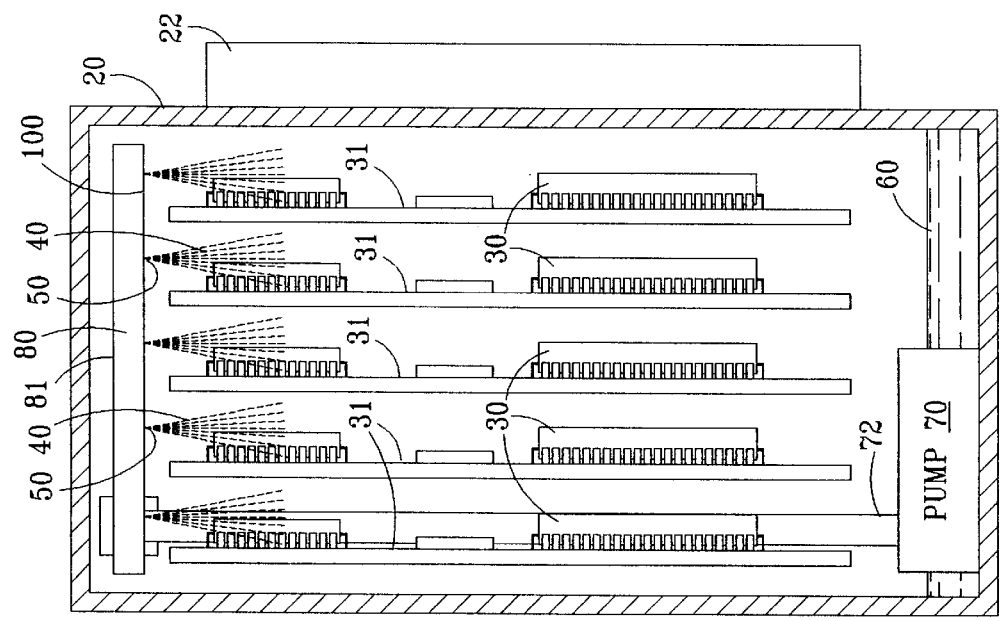

HEAT SPREADER SYSTEM FOR COOLING HEAT GENERATING COMPONENTS

This application claims the benefit of a U.S. application Ser. No. 08/648,548, filed May 16, 1996, which was converted to a provisional application 60/064,857 by Petition to Convert Non-Provisional Application to a Provisional Application Pursuant to 37 C.F.R. § 1.53(b) (2) (ii), filed Apr. 18, 1997.

TECHNICAL FIELD

This invention relates generally to cooling systems for devices requiring cooling to function efficiently and, more particularly, to cooling systems for electronic systems, devices, boards and cards which develop heat during operation.

BACKGROUND OF THE INVENTION

One of the problems accompanying the explosive growth in the use of micro-chips, circuit boards, circuit cards, multi-chip modules, power supplies/converters and power amplifiers and other heat generating parts (hereinafter referred to as "components") is the necessity for dissipating heat generated by these electronic components. In order for the components to function most efficiently and to reduce the risk of malfunction, the electronic components must be maintained in certain desired temperature ranges.

A number of methods for cooling electronic components are currently in use. Placing fans in the housing containing the electronic components and forcing air across the components is one of the most common cooling solutions. However, different electronic components produce different quantities of heat during operation, leading to hot spots. Heat sinks have been used to combat the hot spot problem. However, as the wattage output of electronic components has continued to increase, in order to achieve the desired cooling the heat sinks have become excessively large. External fins have been incorporated on the housing containing the electronic components in an attempt to dissipate the heat build up inside. In sophisticated systems, cooling tubes containing a cooling fluid have been routed around the electronic components in order to conduct the heat to an external heat exchanger. However, cooling tubes and heat exchangers are space intensive and expensive in relation to the present invention.

Electronic hardware manufacturers have introduced sophisticated systems for circulating liquid coolant in the component housing directly around and in contact with the electronic components and then re-circulated back into the housing. The liquid coolant is collected and conducted to a heat exchanger/condenser, usually outside the housing of the electronic components. Such systems are relatively expensive and space intensive as well. Additionally, such systems are inefficient in that they involve single phase cooling.

Much commercial research and development of liquid cooling systems for electronic components and other heat generating parts has been concentrated within the related field of jet impingement of liquid coolants, consisting of a high velocity, narrow jet or jets of liquid directed upon the surface to be cooled. Jet impingement may be confused with spray cooling, particularly in that a liquid coolant is discharged from an orifice and directed at the cooled surface in both cooling methods; however, there are many fundamental and significant differences in the fluid dynamics and heat transfer mechanisms between the impingement of a fluid jet and the impingement of a well-dispersed and atomized spray of liquid droplets over a much larger area. Jet impingement cooling has limitations rendering it inferior to spray cooling. It does not provide uniformity of cooling over the surface, requires higher flow rates for an equivalent average heat flux, and burns out (transition to vapor film boiling with consequent increase in surface temperature) at lower critical heat fluxes (CHF) than spray cooling. When cooled by a jet, the outer region of an area transitions to film boiling (hence, where CHF occurs) at a relatively low heat flux, due to the lower heat transfer coefficients. This both reduces the heat removal in these areas, and increases the local surface temperature. This instantly places an incrementally larger heat removal burden on the inner areas which cannot be accommodated because there is no corresponding incremental increase in heat transfer capability. Thus the film boiling phenomena quickly travels radially inward.

In order to achieve better cooling with jet impingement, attempts have been made to increase the number of jets and thereby decrease the area cooled by each jet. However, the benefits are quickly offset by the geometrically increasing difficulty of delivering and removing large quantities of fluid consequently jet impingement becomes impractical for misting large areas. As will be made clear in the following description, the present invention does not suffer from these limitations. Within the field of single phase jet impingement cooling a number of patents have been issued including U.S. Pat. Nos. 4,108,242; 4,912,600; 4,838,041 and 3,844,343.

To achieve more efficient cooling there have been numerous investigations and attempts into the capabilities of spray cooling. Spray cooling includes the additional advantage of an evaporative phase change. A number of patents including U.S. Pat. Nos. 4,643,250; 4,790,370; 4,643,250; 4,352,392 and 4,967,829 provide insight into the prior art of evaporative cooling. Generally, the prior art has not been successful because either conventional atomizers are unsuitable for viable spray cooling or large spraying distances and system volumes lead to inefficiencies.

U.S. Pat. No. 5,220,804 discloses an atomized liquid sprayed across a wide distribution that impinges upon the surface of the electronic components to be cooled. The heat is transferred to the coolant in an evaporative phase change process. The vapor and liquid is collected and removed to an external condenser. While such a system incorporates the advantage of evaporative phase change cooling, the process of evaporation and condensation is not self contained with in the heat generating components' housing, the liquid coolant and vapor being collected and recirculated by an external pump and condenser. In many applications, including telecommunications, avionics and military, it is very desirable to have self contained units without any external systems. Such self contained systems are advantageous in space constrained systems and avoid potential EMI problems. Additionally, while the atomizers of U.S. Pat. No. 5,220,804 are superior in many respects to previous prior art atomizers in performance, the atomizers of U.S. Pat. No. 5,220,804 are not adaptable to all applications.

SUMMARY OF THE INVENTION

The present invention overcomes significant heat distribution and cooling problems in the prior art of cooling systems for micro-chips, circuit boards, circuit cards, multi-chip modules, power supplies/converters and power amplifiers and other heat generating parts (hereinafter referred to as "components"). The present invention is an isothermal system that takes point sources of heat generated by the operation of electronic components and spreads the heat throughout the system where it may be efficiently dissipated.

The present invention distributes heat generated by components within a sealed housing using an atomized liquid coolant. The present invention includes an atomizer for atomizing the liquid coolant and filling the sealed housing with a fog/mist/spray of coolant. The atomized liquid coolant is distributed as a thin film over the surface of the heat generating components. Heat is transferred from the surface of the heat generating components by vaporization of at least a portion of the thin film of liquid coolant.

BRIEF DESCRIPTION OF THE DRAWINGS

A more complete understanding of the invention may be had by reference to the following Detailed Description taken in conjunction with the accompanying Drawings, wherein:

FIG. 2 is an end view section of a housing containing electronic components and the heat spreader system of FIG. 1;

FIG. 3 is a front view section of the housing containing electronic components and the heat spreader system of FIG. 1;

DETAILED DESCRIPTION

Figure 1:
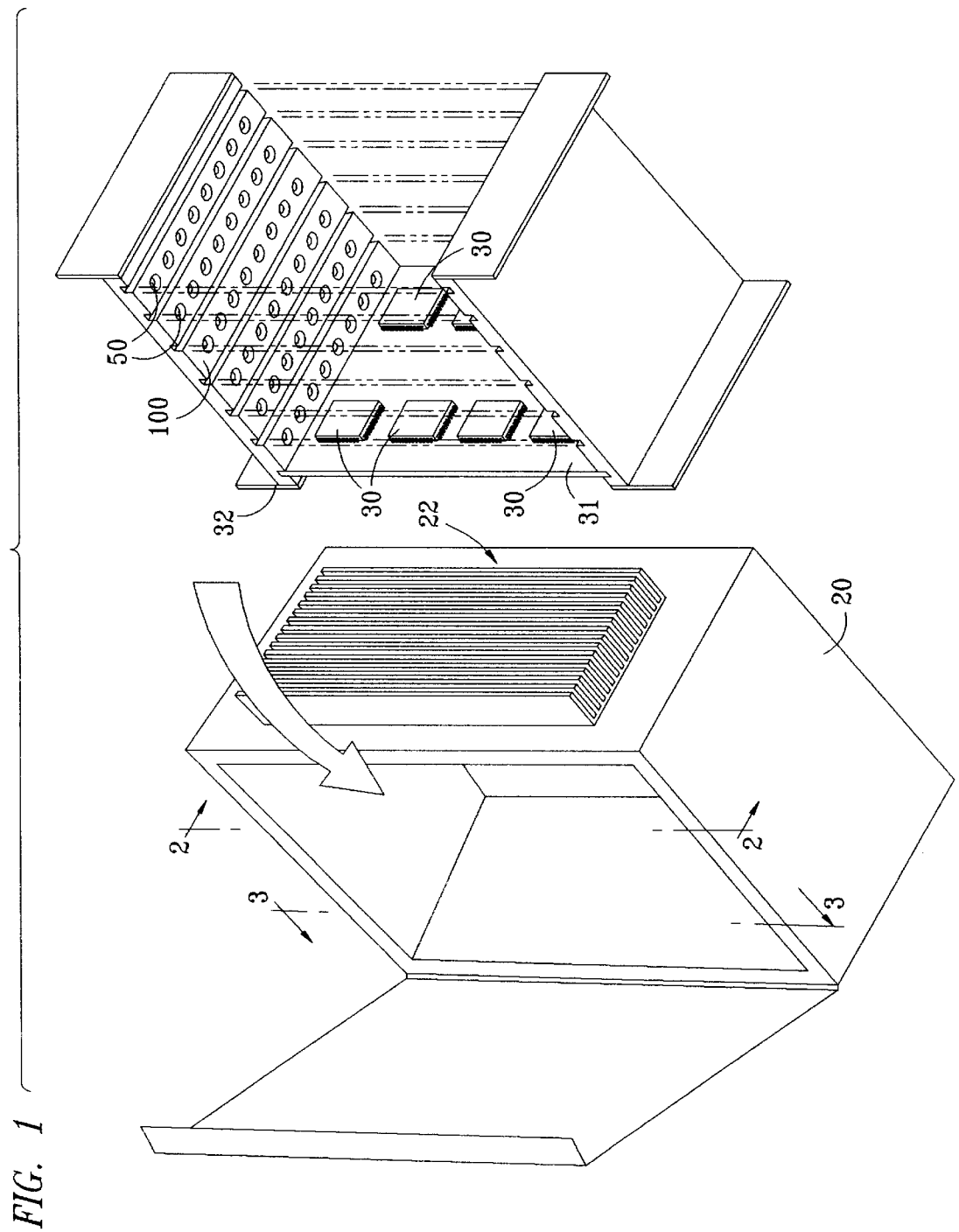
FIG. 1 is an exploded perspective view of a housing containing electronic components and the heat spreader system of the present invention.

Referring now to the Drawings wherein like reference characters denote like or similar parts throughout the FIGURES. Referring to FIG. 1, therein is illustrated sealed housing 20 for enclosing electronic components 30 mounted on component cards 31 wherein the component cards 31 are held in a typical component tray 32. Liquid coolant spray plate 100 including atomizers 50 and cooling fins 22 are also illustrated.

Figure 3A:
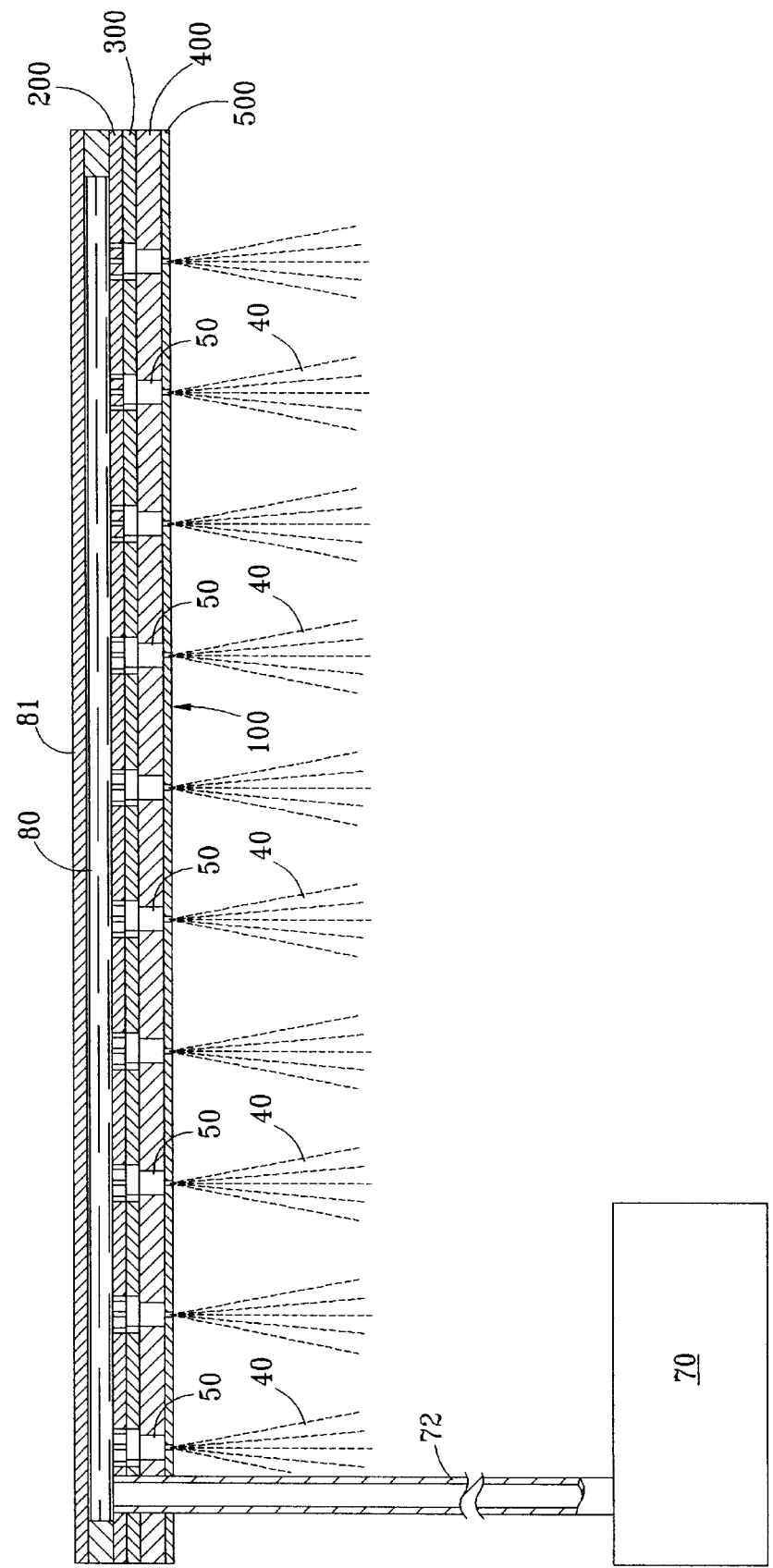
FIG. 3A is a partial front view section of a spray chamber and spray plate of the heat spreader system of FIG. 1.
Figure 4:
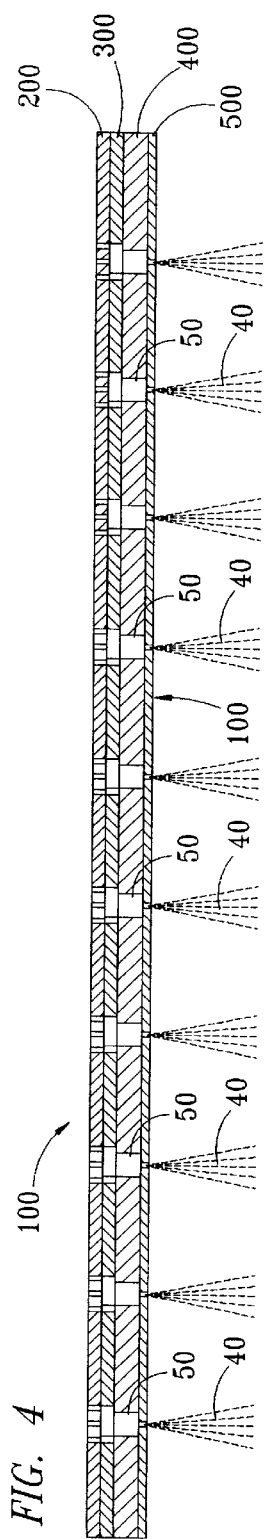
FIG. 4 is a side view section of a spray plate of the heat spreader system of FIG. 1.
Figure 5:
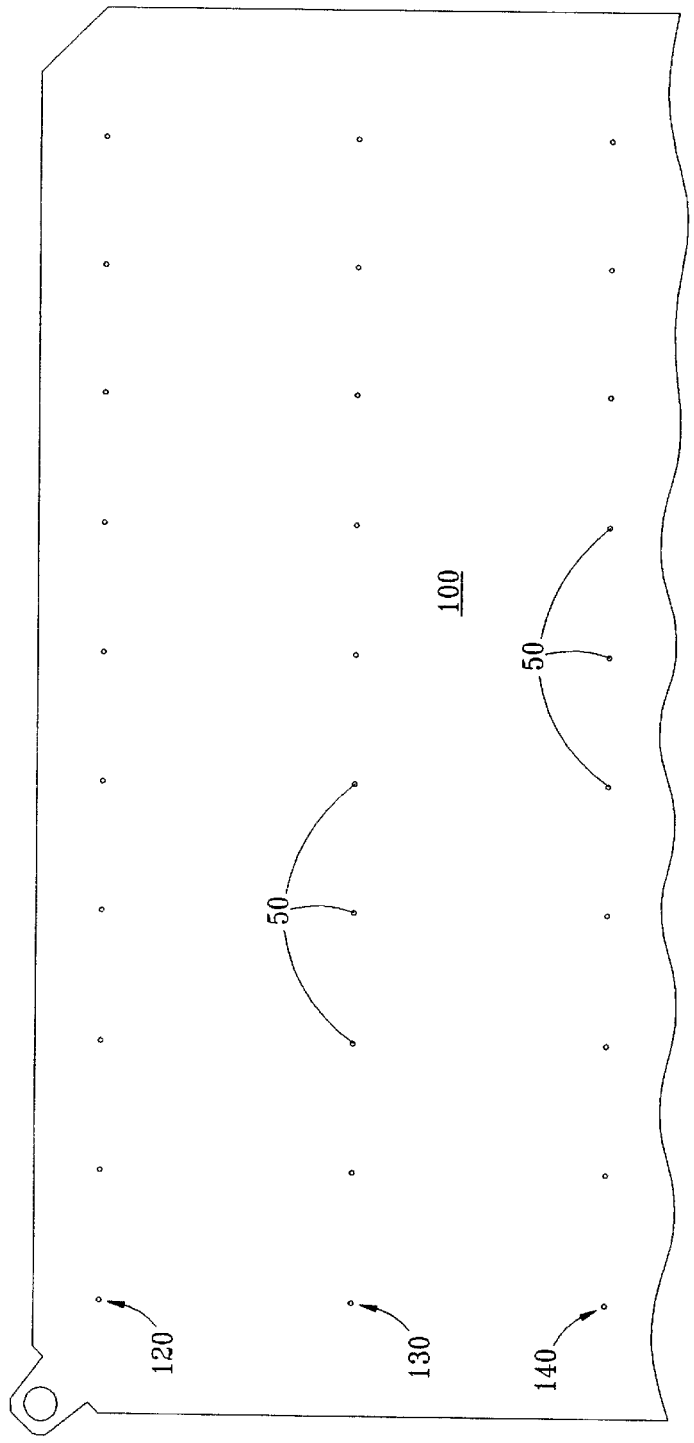
FIG. 5 is a partial top view of the spray plate of FIG. 4.

Referring now to FIGS. 2, 3 and 3A, therein are illustrated section views of the sealed housing 20 containing the electronic components 30 mounted on component cards 31 and the heat spreader system 10 of the present invention. The present invention is an isothermal equilibrium established system within a closed environment that takes point sources of heat generated by the operation of the electronic components 30 and spreads the heat throughout the liquid and gaseous coolant 40 in the housing 20 where it may be efficiently dissipated through the housing 20 and external cooling fins 22.

In the first embodiment, the heat spreader system 10 produces atomized liquid droplets of coolant 40 sprayed upon the surface of the electronic components 30 to be cooled. In operation, the atomized fog/mist/spray of liquid coolant 40 will be conformable to and in direct contact with electronic components 30 contained in the sealed housing 20. It is understood that "atomizing" and "atomized" as used herein encompasses a fog/mist/spray of fine and/or coarse droplet sizes. It is further understood that as used herein "atomizer" encompasses a device for creating a fog/mist/spray of fine and/or coarse droplet sizes. Heat is transferred to the coolant 40 in a thin film evaporative phase change process. The atomized liquid 40 may be "FC72" coolant such as Fluorinert™, a dielectric cooling fluid manufactured by the 3M Company.

The present invention reduces or eliminates the necessity of using heat sinks and complicated, expensive tube cooling systems to achieve the desired cooling. In the first embodiment (see FIGS. 1,2 and 3) the present invention is self contained. In many applications, including telecommunications, avionics and military, it is very desirable to have self contained units without external cooling systems. Such sealed systems minimize EMI problems. Because the present invention alleviates the space intensive use of heat sinks and spreads the heat created in hot spots around the system, more electronic components may be incorporated into the same size housing. This is a distinct advantage in military, avionics and telecommunications applications.

Because the liquid coolant 40 is dispersed in a fog/mist/spray in the housing 20, the present invention has the added advantage of requiring a minimum volume of liquid coolant 40. Circulating liquid systems, as discussed in the background section, add significant weight to a cooling system because the liquid coolant in such systems is maintained in a pure liquid state as opposed to the fog/mist/spray state of the present invention. Densities of coolants in such systems are typically greater than water and can add significant weight to the total systems. The additional weight is particularly undesirable in avionics and many military applications.

Referring to FIGS. 2, 3, 3A, and 5, a plurality of atomizers 50 in a customized pattern are located in a spray plate 100. The spray plate 100 is positioned at a first end of the housing 20 such that rows of the atomizers 50 are located between each row of the component cards 31 supporting the electronic components 30 to be cooled. As illustrated in FIG. 3A, the spray plate 100 is a first component of a spray chamber 80 that includes a backing component 81.

Referring to FIGS. 2 and 3, the atomized liquid coolant 40 and liquid condensed after the vaporization heat transfer process is collected in a reservoir 60 located at a second end of the housing 20. A pump 70 recirculates the collected coolant 40 via supply line 72 to the spray chamber 80. The pump 70 is preferably a self contained DC brushless pump capable of at least a 20 psi output pressure, similar to typical brushless automobile fuel pumps. Such pumps are commercially available. In the preferred embodiment, the pump 70, the pump motor, and the motor controller are self contained in the housing 20.

It should be understood that the spray plate 100 is capable of numerous rearrangements and substitutions of parts and elements without departing from the spirit of the invention. Additionally, and not by way of limitation, the atomizers 50 may be arranged in various patterns to conform to the arrangement of the heat generating components (FIG. 2).

Referring again to FIGS. 2 and 3, in operation, liquid coolant 40 supplied to the spray chamber 80 is supplied to each atomizer 50 to generate a vortex of coolant 40 in a vortex chamber that is atomized when it exits the atomizers 50.

Figure 6:
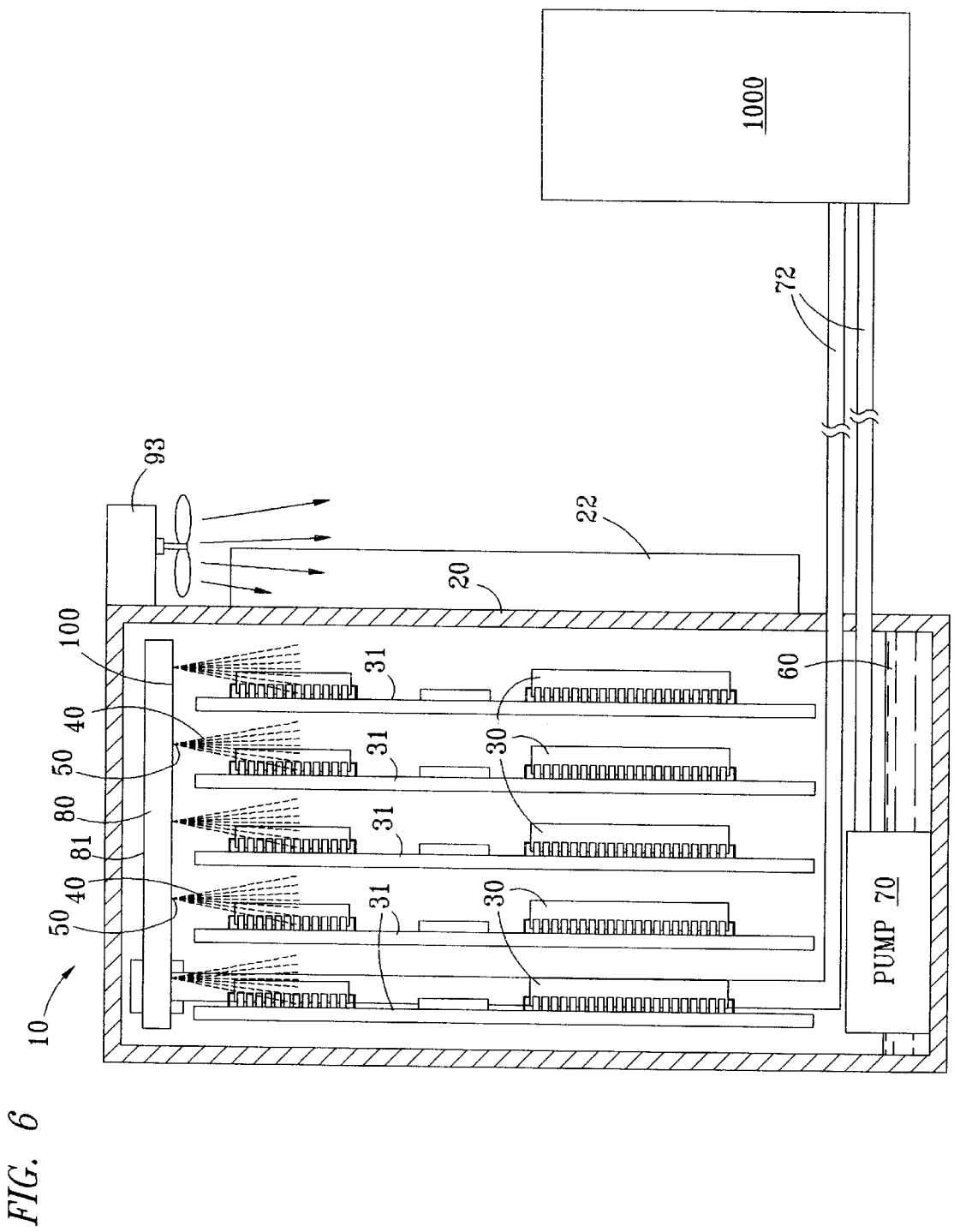
FIG. 6 is a second embodiment of the heat spreader system of the present invention.

A second embodiment of the heat spreader system of the present invention is illustrated in FIG. 6. In order to achieve additional cooling, an external cooler 1000 may be positioned intermediate in the coolant supply line 72 between the pump 70 and the spray chamber 80. As heat loads continue to increase due to increasing wattage of electronic components, additional cooling may be achieved with the heat spreader system of the present invention by using a fan 93 to force air across the outside of the housing 20 and/or the external cooling fins 22.

Figure 7:
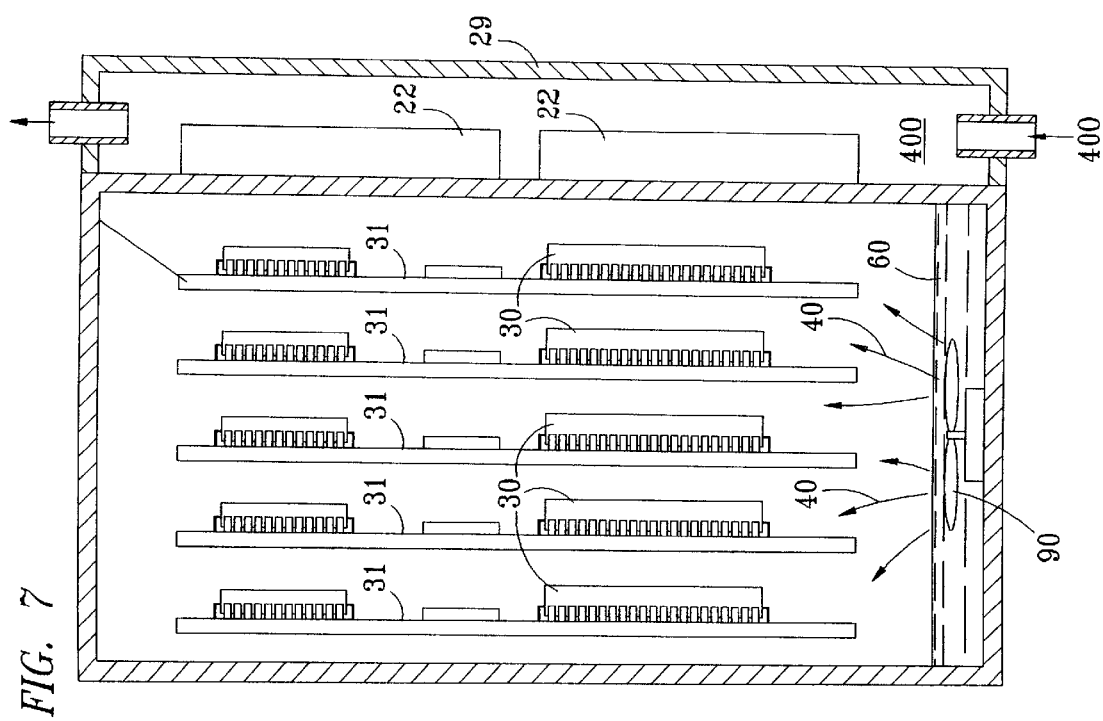
FIG. 7 is a third embodiment of the heat spreader system of the present invention.

A third embodiment of the heat spreader system of the present invention is illustrated in FIG. 7. FIG. 7 illustrates the present invention using other methods of creating a fog/mist/spray of liquid coolant. A mechanical stirrer or paddle 90, located inside the housing 20, agitates the liquid coolant 40, collected in reservoir 60, and disperses it over the heat generating components 30. If additional cooling is required, an additional housing 29 is used to enclose cooling fins 22. A liquid coolant 400 is circulated across cooling fins 22. Heat is transferred to the coolant 400 and then conducted away from the heat generating component housing.

Figure 8:
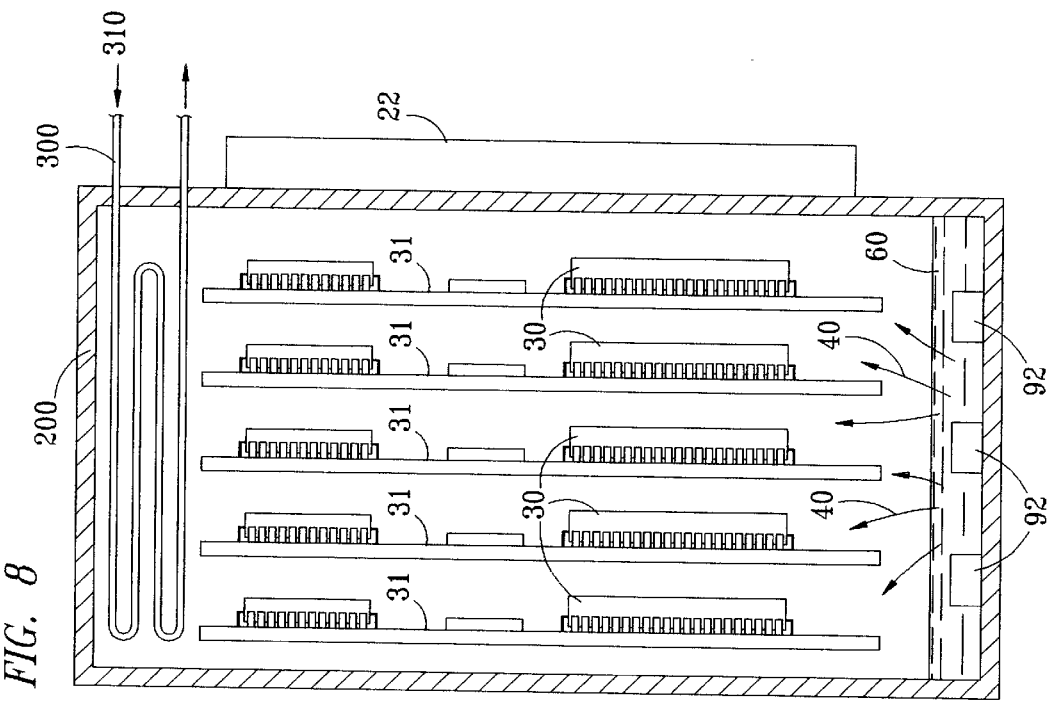
FIG. 8 is a fourth embodiment of the heat spreader system of the present invention.

Referring to FIG. 8, therein is illustrated a fourth embodiment of the present invention. An ultrasonic agitator 92 is used to create a fog/mist/spray of liquid coolant that is dispersed across the heat generating components. If additional cooling is desired, heat exchanger tubes 200 may be included inside the sealed housing 20. An second liquid or gaseous coolant 300 is circulated through the exchanger tubes 200. Heat is transferred to the coolant 300 and then conducted away from the heat generating component housing. Heat exchanger tubes 200 have the added advantage of providing additional cool surfaces on which vaporized coolant 40 may be condensed and recycled.

Although preferred and alternative embodiments of the invention have been illustrated in the accompanying Drawings and described in the foregoing Detailed Description, it will be understood that the invention is not limited to the embodiments disclosed, but is capable of numerous rearrangements and substitutions of parts and elements without departing from the spirit of the invention.

We claim:

1. A closed cycle system for spreading heat generated by heat generating components comprising:

a housing having an internal cooling chamber and including a liquid coolant reservoir as part of the cooling chamber;

at least one component board mounted in the internal cooling chamber adjacent the liquid coolant reservoir and opened thereto, the at least one component board supporting heat generating components;

at least one atomizer for atomizing a liquid coolant and distributing the atomized liquid coolant over the surface of the heat generating components supported on the at least one component board;

a pump in the cooling chamber within said housing and connected to said at least one atomizer for recirculating liquid coolant collected in the coolant reservoir to the at least one atomizer;

cooling fins affixed to an external surface of the housing for providing convection cooling; and a means attached to said housing for circulating air across said fins.

2. The system for spreading heat of claim 1 wherein said at least one atomizer comprises a plurality of atomizers positioned in a customized pattern, said customized pattern directing atomized liquid coolant over the surface of the heat generating components supported on the at least one component board.

3. The system for spreading heat of claim 1 further including a spray chamber within said housing connected to said pump and supporting said at least one atomizer for supplying liquid coolant thereto.

4. A closed cycle system for spreading heat generated by heat generating components comprising:

a sealed housing having an internal cooling chamber and including a liquid coolant reservoir as a part of the cooling chamber;

at least one component board mounted in the internal cooling chamber adjacent the liquid coolant reservoir and opened thereto, the at least one component board supporting heat generating components;

at least one atomizer for atomizing a liquid coolant and distributing the atomized liquid coolant over the surface of the at least one component board;

a spray chamber supporting the at least one atomizer;

a pump in the cooling chamber for recirculating liquid from the liquid coolant reservoir to the spray chamber;

a tube connecting the pump to the spray chamber for recirculating the liquid coolant collected in the coolant reservoir entirely within the sealed housing;

cooling fins affixed to an external surface of the housing for providing convection cooling; and a means attached to said housing for circulating air across said fins.

5. A closed cycle system for spreading heat generated by heat generating components comprising:

a housing having an internal cooling chamber including a liquid coolant reservoir as part of the cooling chamber;

at least one component board mounted in the internal cooling chamber adjacent the liquid coolant reservoir and opened thereto, the at least one component board supporting heat generating components;

a dielectric liquid coolant in the coolant reservoir;

at least one atomizer for atomizing the dielectric liquid coolant and distributing the atomized liquid coolant over the surface of the at least one component board;

a pump in the cooling chamber of said housing and connected to said at least one atomizer for recirculating the dielectric liquid coolant collected in the coolant reservoir to the at least one atomizer;

fins affixed to an external surface of the housing;

a second housing enclosing said fins; and means for circulating a second coolant through said second housing and across said fins.

6. The system for spreading heat of claim 5 further including:

heat exchanger tubes located inside the housing and in contact with the liquid coolant; and means for circulating a second liquid coolant through said heat exchanger tubes.

7. The system for spreading heat of claim 5 wherein the at least one atomizer includes an ultrasonic agitator.

8. The system for spreading heat of claim 5 wherein the at least one atomizer includes a mechanical agitator.

* * * * *